(12) United States Patent
Woo

(10) Patent No.: US 6,830,969 B2
(45) Date of Patent: Dec. 14, 2004

(54) METHOD FOR MANUFACTURING SEMICONDUCTOR DEVICE AND THE DEVICE THEREOF

(75) Inventor: Won Sic Woo, Koori-Shi (KR)

(73) Assignee: Hynix Semiconductor INC, Ichon-shi (KR)

( * ) Notice: Subject to any disclaimer, the term of this patent is extended or adjusted under 35 U.S.C. 154(b) by 37 days.

(21) Appl. No.: 10/321,631

(22) Filed: Dec. 18, 2002

(65) Prior Publication Data

US 2004/0014289 A1 Jan. 22, 2004

(30) Foreign Application Priority Data

Jul. 18, 2002 (KR) ................................ 10-2002-0042164

(51) Int. Cl.$^7$ ............................................. H01L 21/336
(52) U.S. Cl. ....................... 438/218; 438/262; 438/257
(58) Field of Search ............................. 438/288, 591, 438/294, 411, 284, 218, 248, 257, 259, 262, 405, 435, 593

(56) References Cited

U.S. PATENT DOCUMENTS

| | | | | |
|---|---|---|---|---|
| 5,015,601 A | * | 5/1991 | Yoshikawa | 438/262 |
| 5,151,375 A | * | 9/1992 | Kazerounian et al. | 438/262 |
| 5,385,856 A | * | 1/1995 | Hong | 438/262 |
| 5,418,175 A | * | 5/1995 | Hsue et al. | 438/262 |
| 6,144,064 A | * | 11/2000 | Cho et al. | 257/321 |
| 6,211,074 B1 | * | 4/2001 | Huang et al. | 438/655 |
| 6,335,553 B1 | * | 1/2002 | Ra | 257/314 |
| 6,368,916 B1 | * | 4/2002 | Nakagawa | 438/257 |
| 6,465,302 B1 | * | 10/2002 | Ahn et al. | 438/257 |
| 6,642,586 B2 | * | 11/2003 | Takahashi | 257/390 |
| 6,677,199 B1 | * | 1/2004 | Chang et al. | 438/257 |
| 6,686,242 B2 | * | 2/2004 | Willer et al. | 438/257 |
| 6,689,658 B2 | * | 2/2004 | Wu | 438/257 |

* cited by examiner

Primary Examiner—Matthew Smith
Assistant Examiner—Chuong Anh Luu
(74) Attorney, Agent, or Firm—Jacobson Holman PLLC

(57) ABSTRACT

The present invention relates to a method of manufacturing a semiconductor device. The method comprises the steps of forming a plurality of lower bit lines arranged in a first direction on a semiconductor substrate by performing ion implantation using a mask defining the lower bit lines, forming a lower field oxide film within a region in which the lower bit lines are formed to define an active region and a device isolation region, forming a first insulating film for accumulating charges on the active region, forming a plurality of word lines arranged in parallel in a second direction orthogonal to the first direction of the lower bit lines, depositing an oxide film on the entire structure of the semiconductor substrate including the lower bit lines and the word lines, flattening the oxide film and then removing the oxide film on the word lines, forming a second insulating film for accumulating charges corresponding to the first insulating film for accumulating charges on the word lines and then forming an upper field oxide film corresponding to the lower field oxide film on the word lines, depositing polysilicon on the entire structure of the semiconductor substrate, performing ion implantation using a mask defining upper bit lines for polysilicon to form the upper bit lines, and then performing ion implantation using a mask defining an upper substrate to form the upper substrate, and removing given portions of the upper bit lines formed on the upper field oxide film to separate the upper bit lines.

5 Claims, 4 Drawing Sheets

US 6,830,969 B2

METHOD FOR MANUFACTURING SEMICONDUCTOR DEVICE AND THE DEVICE THEREOF

BACKGROUND OF THE INVENTION

1. Field of the Invention

The invention relates generally to a method of manufacturing a semiconductor device, and more particularly to a method of manufacturing a semiconductor device having a MONOS(metal-oxide-nitride-oxide-semiconductor)/ SONOS(semiconductor-oxide-nitride-oxide-semiconductor) structure of nonvolatile semiconductor storage devices.

2. Description of the Prior Art

Currently, in view of the process technologies, NVSMs (nonvolatile semiconductor memories) are mainly classified into floating gate series and MIS (metal insulator semiconductor) series in which the dielectric films of over two types are stacked in a dual or a triple.

In the floating gate series, a storage characteristic is implemented using a potential well. An ETOX (EPROM tunnel oxide) structure that has been widely used as a flash EEPROM (electrically erasable programmable read only memory) is a representative one. On the other hand, in the MIS series, a storage function is implemented using a trap existing at the dielectric film bulk, the interface of the dielectric film-dielectric film and the dielectric film-semiconductor interface. A MONOS (metal-oxide-nitride-oxide semiconductor) or SONOS (semiconductor-oxide-nitride-oxide semiconductor) structure that has be widely used as a flash EEPROM is a representative one.

The semiconductor device having the conventional MONOS/SONOS structure will be described by reference to FIG. 10.

FIG. 10 is a cross sectional view of the MONOS/SONOS memory device of the conventional MIS series nonvolatile semiconductor storage devices.

As shown in FIG. 10, a first oxide film 102, a nitride film 103, a second oxide film 104 and a gate electrode 105 are sequentially stacked on a given region of a P type semiconductor substrate 101. A source region 106 and a drain region 107 are formed in the semiconductor substrate 101 at both sides of the stack structure. At this time, the first oxide film 102 is used as a tunneling oxide film and the second oxide film 104 is used as a blocking oxide film.

The method of manufacturing the semiconductor device includes forming an ONO (oxide nitride oxide) structure in which the first oxide film 102 is formed on the semiconductor substrate 101, and the nitride film 103 and the second oxide film 104 are sequentially formed on the first oxide film 102. Next, polysilicon into which an impurity is doped is formed on the semiconductor substrate 101 in which the ONO structure is formed. A gate electrode 105 is then formed through photolithography and etch processes. Also, A N type impurity ion is implanted using the gate electrode 105 selectively removed as a mask, thus forming the source region 106 and the drain region 107 in the semiconductor substrate 101.

In this structure, a channel hot electron injection mode is used for a programming operation. In other words, if a positive (+) voltage of a sufficient high is applied to the gate electrode 105, the electrons are tunneling from the semiconductor substrate 101 through the first oxide film 102 on the semiconductor substrate 101 and are then injected into the nitride film 103. At this time, the second oxide film 104 on the nitride film 103 serves to prevent the electrons injected into the nitride film 103 from leaking to the gate electrode 105 and also prevent injection of holes from the gate electrode 105 to the nitride film 103. In this sense, the first oxide film 102 on the semiconductor substrate 101 is called the tunneling oxide film and the second oxide film 104 on the nitride film 103 is called the blocking oxide film. The electrons, which tunneled the first oxide film 102 and are then injected into the nitride film 103, are trapped at the nitride film bulk trap and each of the interface traps at both sides of the nitride film. Due to this, the threshold voltage is increased.

On the contrary, a hot hole injection mode is used for an erase operation. Electrons trapped by applying a negative (−) voltage to the gate electrode 105 are discharged toward the semiconductor substrate 101, so that the threshold voltage is lowered to a value before the program operation. At this time, it is advantageous to reduce the thickness of the first oxide film 102 in view of the program and erase operation. However, it is advantageous to increase the thickness of the first oxide film 102 in view of a storage characteristic.

In the nonvolatile memory device having this MONOS/SONOS structure, information of 2 bits can be stored at each of the cells. Recently, however, as the memory semiconductor devices have been widely used in various information processing devices including computers or mobiles and must store a large amount of information, the method by which information of 2 bits is stored at a single cell is problematic in the information storage capacity of the memory device.

SUMMARY OF THE INVENTION

The present invention is contrived to solve the above problems and an object of the present invention is to provide a method of manufacturing a semiconductor device capable of improving the data storage capacity, by which information of 4 bits can be stored at a single cell using a stack structure.

Another object of the present invention is to provide a semiconductor device capable of improving the data storage capacity, in which information of 4 bits can be stored at a single cell using a stack structure.

In order to accomplish the above object, a method of manufacturing a semiconductor device according to the present invention, is characterized in that it comprises the steps of forming a plurality of lower bit lines arranged in a first direction on a semiconductor substrate by performing ion implantation using a mask defining the lower bit lines, forming a lower field oxide film within a region in which the lower bit lines are formed to define an active region and a device isolation region, forming a first insulating film for accumulating charges on the active region, forming a plurality of word lines arranged in parallel in a second direction orthogonal to the first direction of the lower bit lines, depositing an oxide film on the entire structure of the semiconductor substrate including the lower bit lines and the word lines, flattening the oxide film and then removing the oxide film on the word lines, forming a second insulating film for accumulating charges corresponding to the first insulating film for accumulating charges on the word lines and then forming an upper field oxide film corresponding to the lower field oxide film on the word lines, depositing polysilicon on the entire structure of the semiconductor substrate, performing ion implantation using a mask defining upper bit lines for polysilicon to form the upper bit lines, and then performing ion implantation using a mask defining an upper substrate to form the upper substrate, and removing given portions of the upper bit lines formed on the upper field oxide film to separate the upper bit lines.

In order to accomplish another object, a semiconductor device according to the present invention, is characterized in that it comprises a plurality of lower bit lines arranged in parallel in a first direction on a semiconductor substrate, a lower field oxide film formed within the lower bit lines and defining an active region and a device isolation region, a first insulating film for accumulating charges formed on the active region having a structure in which a nitride film and an oxide film are sequentially stacked on an oxide film, a plurality of word lines arranged in parallel in a second direction orthogonal to the first direction of the lower bit lines, a second insulating film for accumulating charges formed on the word lines, corresponding to the first insulating film for accumulating charges, and having a structure in which a nitride film and an oxide film are sequentially stacked on an oxide film, an upper field oxide film formed on the word lines and corresponding to the lower field oxide film, a plurality of upper bit lines arranged in parallel in the first direction on the upper field oxide film and the second insulating film for accumulating charges and corresponding to the lower bit lines, and an upper substrate formed between the plurality of the upper bit lines on the second insulating film for accumulating charges.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

Figure 1:
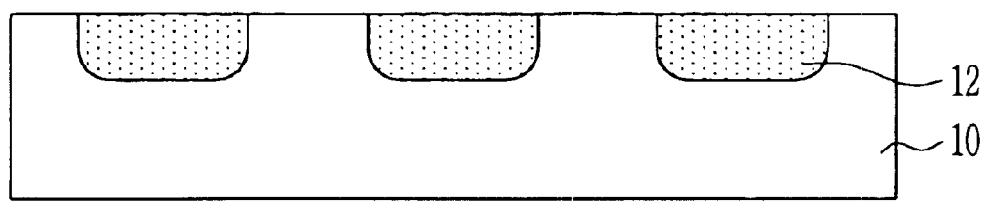
FIG. 1 through FIG. 8 are cross sectional views and plan views of semiconductor devices for explaining a method of manufacturing the semiconductor device according to one embodiment of the present invention.

The present invention will be described in detail by way of a preferred embodiment with reference to accompanying drawings, in which like reference numerals are used to identify the same or similar parts.

FIG. 1 through FIG. 8 are cross sectional views and plan views of semiconductor devices for explaining a method of manufacturing the semiconductor device according to one embodiment of the present invention.

Referring first to FIG. 1, bit lines 12 are formed in a semiconductor substrate 10. In more detail, the bit lines 12 are formed by forming a photoresist pattern having apertures each corresponding to the bit lines 12 and then performing ion implantation through the apertures of the photoresist pattern. At this time, ion implantation may be performed using arsenic (As), or the like. Therefore, a plurality of N type diffusion regions corresponding to the bit lines are formed in parallel in the substrate.

Figure 2:
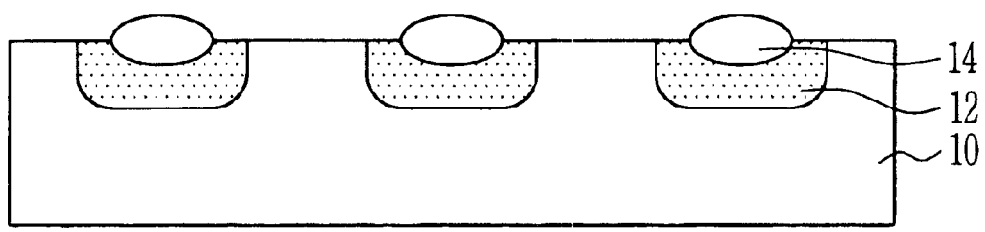

By reference to FIG. 2, a lower field oxide film 14 is formed within the bit line diffusion region 12 by means of a given isolation process. Next, an implantation process for controlling threshold voltage is performed.

Figure 3:
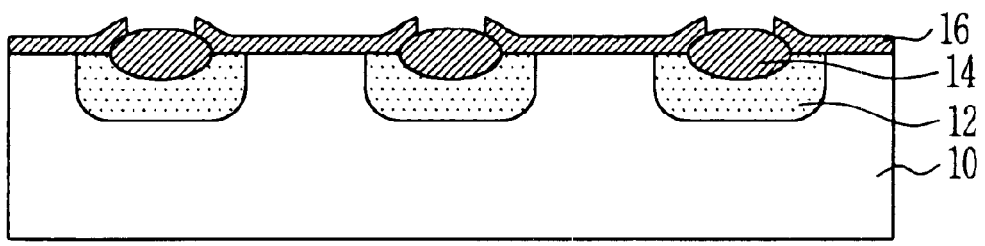

Referring now to FIG. 3, a first ONO film 16 is formed on the active region. In more concrete, in the active region, an oxide film is formed on the exposed surface of the substrate, a nitride film is formed on the oxide film and an oxide film is then formed on the nitride film, thus completing the ONO film having the structure of the oxide film/the nitride film/the oxide film (oxide-nitride-oxide). At this time, the oxide film and the nitride film may be formed by a chemical vapor deposition (CVD) method, etc.

Figure 4A:
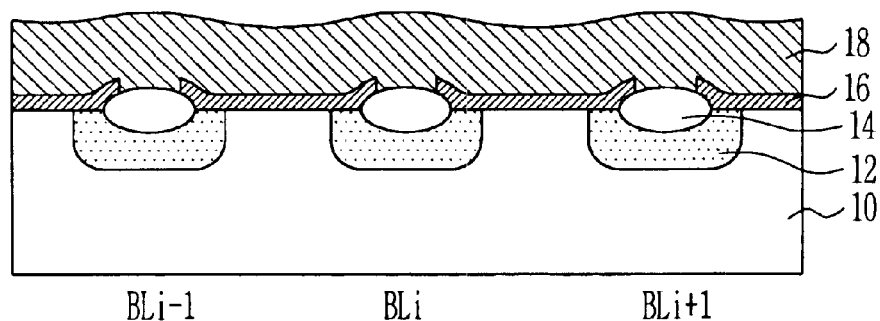
Figure 4B:
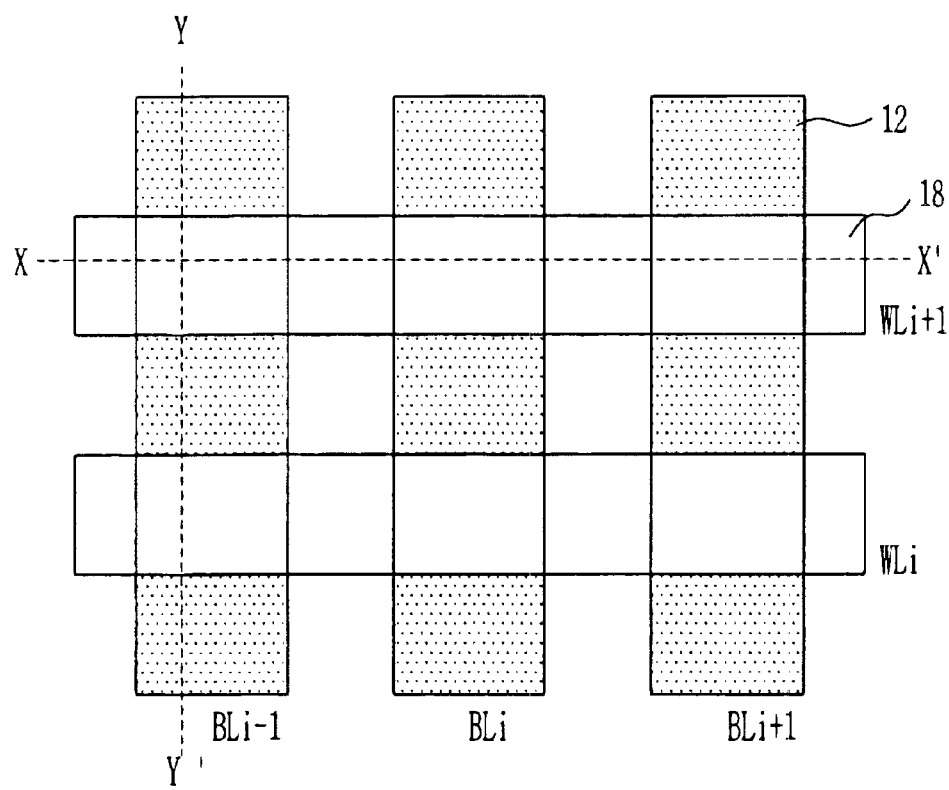
Figure 4C:
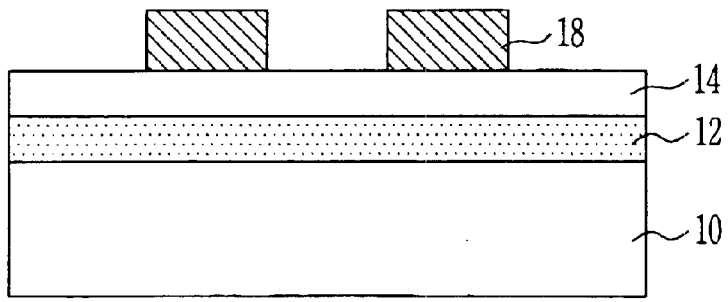

Referring now to FIG. 4A, word lines 18 are formed in a direction orthogonal to the direction along which the bit lines 12 are extended. At this time, the word lines 18 are formed of polysilicon using a given mask. FIG. 4B is a plan view of the semiconductor device in which the bit lines 12 and the word lines 18 are formed on the semiconductor substrate 10. From FIG. 4B, it can be seen that the bit lines ($BL_{i-1}$, $BL_i$, $BL_{i+1}$) and the word lines ($WL_i$, $WL_{i+1}$) are arranged in plural while they are orthogonal to one another. As a result, the cross section of the semiconductor device taken along lines X-X' in FIG. 4B is FIG. 4A. Also, the cross section of the semiconductor device taken along lines Y-Y' in FIG. 4B is FIG. 4C. From the drawings, it can be seen that the bit lines 12 and the lower field oxide film 14 are formed on the semiconductor substrate 10 and the plurality of the word lines 18 are formed on them in the direction orthogonal to the bit lines 12.

Figure 5:
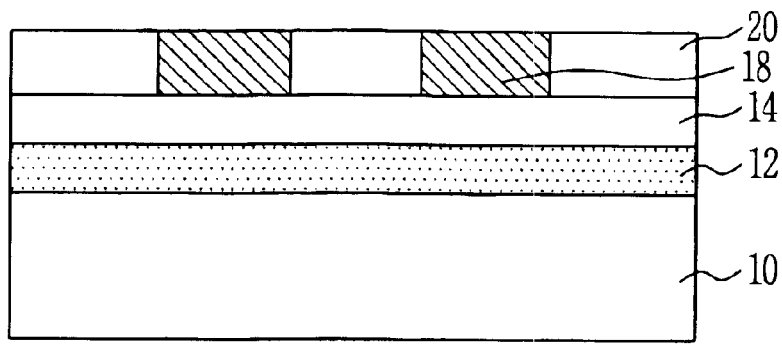

Next, an oxide film is deposited on the entire structure of the semiconductor substrate including the word lines 18 and the bit lines 12. The oxide film is then flattened by a chemical mechanical polishing (CMP) process. At this time, it is preferred that the oxide film is formed in thickness of below 7000 Å. Thereafter, the oxide film on the word lines 18 is removed by an etch processing using a given mask. Thus, a structure in which the oxide film 20 is formed between the word lines 18 is completed, as shown in FIG. 5.

Figure 6:
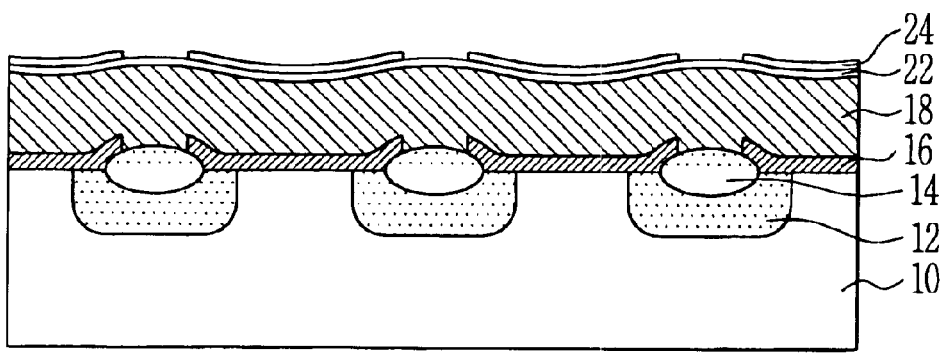

Referring now to FIG. 6, in order to form a second ONO film, a first oxide film 22 is deposited on the entire structure of the semiconductor substrate 10. Next, a nitride film 24 is deposited on the first oxide film 22. At this time, it is preferred that the first oxide film 22 is formed in thickness of below 50 Å and the nitride film 24 is formed in thickness of below 60 Å. After the nitride film is deposited, the nitride film at all the portions except for a region where the second ONO film will be formed using a photoresist pattern by which all the portions except for the region where the first ONO film is formed, are opened.

Figure 7:
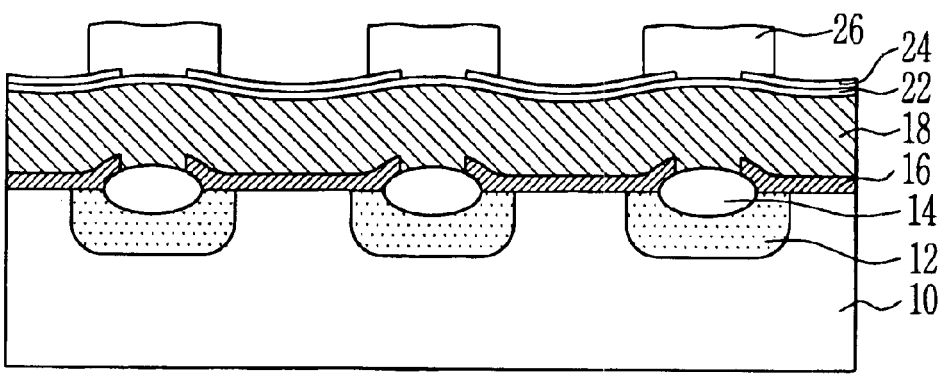

By reference to FIG. 7, an oxide film is deposited on the entire structure. Next, an upper field oxide film 26 corresponding to the lower field oxide film 14 formed within the bit lines 12 is formed by means of an etch process using a given mask. Thereafter, as the oxide film on the word lines can be removed due to misalignment when a next photoresist pattern is formed, an oxide film is deposited and is then etched to form a spacer (not shown) in order to prevent misalignment. At this time, it is preferred that the oxide film is deposited in thickness of below 500 Å.

Figure 8:
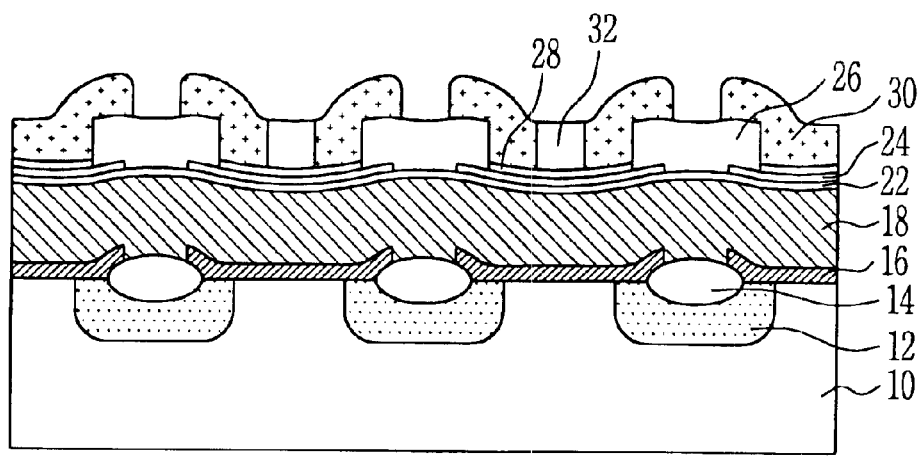

Referring now to FIG. 8, a second oxide film 28 of below 50 Å in thickness is deposited on the entire structure of the semiconductor substrate 10. Thereby, the second ONO films 22, 24 and 28 are completed.

Next, polysilicon is deposited on the entire structure of the semiconductor substrate 10. Ion implantation using a given mask is then performed to define a N+ region 30 used as the bit lines and a P+ region 32 used as the substrate. Thereafter, given portions of the N+ region 30 formed on the upper field oxide film 26 are removed by an etch process using a given mask, so that the respective bit lines 30 are separated.

The operation of the semiconductor device formed thus will be now described by reference to FIG. 9.

Figure 9:
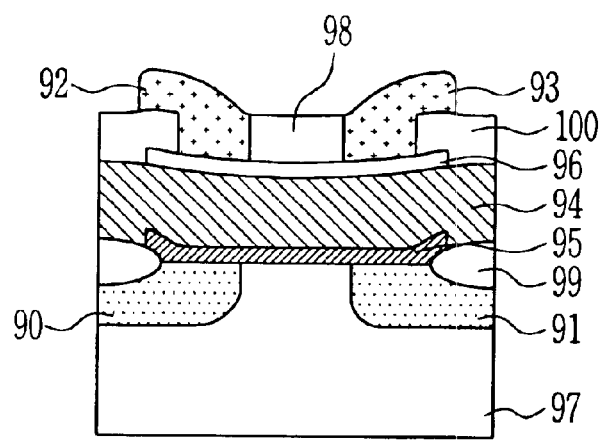
FIG. 9 is a cross-sectional view of a semiconductor device having a stack structure for explaining the operation of the device according to one embodiment of the present invention.
Figure 10:
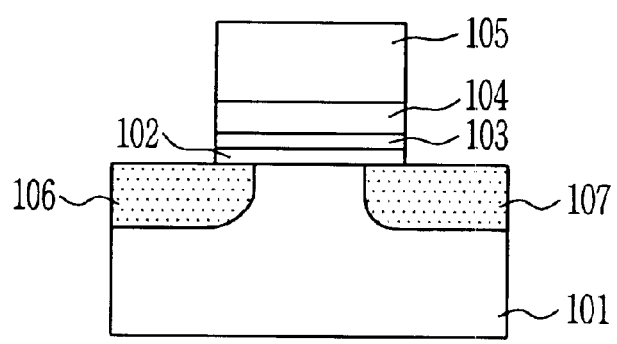
FIG. 10 is a cross sectional view of a conventional MONOS/SONOS memory device.

FIG. 9 is a cross-sectional view of the semiconductor device having the stack structure for explaining the operation of the device according to one embodiment of the present invention. The semiconductor device includes first through fourth bit lines 90, 91, 92 and 93, a common word line 94, first and second ONO films 95 and 96, a lower substrate 97 and an upper substrate 98, a lower field oxide film 99, and an upper field oxide film 100. In this structure, the first bit line 90 is used as a first source and the second bit line 91 is used as a first drain. Also, the third bit line 92 is used as a second source and the fourth bit line 93 is used as a second drain. The word line 94 used as the common gate is commonly used by the upper and lower structures. Also, ONO films 95 and 96 for trapping electrons are formed in the lower and upper structures.

A process of programming information will be first explained.

In order to program information, the first source 90 is grounded, a high positive voltage+$V_{w1}$ is applied to the first drain 91 or a high positive voltage +$V_{g1}$ is applied to the common gate 94. As a result, the hot electrons are generated within the channel by means of acceleration of the electrons in the first drain 91 of the channel region. The hot electrons generated thus are then injected into the first ONO film 95. Next, the injected hot electrons are hold at a place around the first drain 91 within the first ONO film 95. At this time, the hot electrons may be injected around the first source 90 of the first ONO film 95 by changing the driving voltage applied to the first drain 91 and the first source 90. Therefore, 1-cell 2-bit programming is made possible in the lower transistor having the first ONO film 95. In the same manner, if the ground voltages, a high positive voltage+$V_{w2}$ and a high positive voltage +$V_{g2}$ are applied to the second source 92, the second drain 93 and the common gate 94, respectively, the hot electrons are trapped in the second ONO film 96. Thus, 2-bit write is made possible and 1-cell 4-bit programming is resultantly made possible.

Next, in order to erase the program information, if a high positive voltage +$V_e$ is applied to the first drain 91 and a high negative voltage -$V_{g3}$ is applied to the common gate 94, holes are injected from the first drain 91 to the first ONO film 95 and electrons accumulated around the first drain region 91 within the first ONO film 95 are erased. If the electrons are accumulated around the first source 90 region within the first ONO film 95, it is better to inject the holes from the first source 90. Further, when information stored at the second ONO film 96 is to be erased, the same method is used.

Also, in order to read information programmed around the first drain 91 region of the first ONO film 95, a given gate voltage $V_{g4}$ is applied to the common gate electrode 94, the first drain 91 is grounded and a read voltage $V_r$ is applied to the first source 90. As a result, if the electrons are not accumulated around the first drain 91 of the first ONO film 95, carriers can flow from the first drain 91 to the first source 90 through the channel formed below the first gate electrode 94. On the contrary, if the electrons are accumulated around the first drain 91 of the first ONO film 95, the channel below the common gate electrode 94 is shielded in the first drain 91. Meanwhile, in order to read information programmed around the first source 90 region of the first ONO film 95, the first source 90 is grounded and a read voltage $V_r$ is applied to the first drain 91. Also, when information stored at the second ONO film 96 is to be read, the same method is used.

As mentioned above, according to the present invention, in order to store information of 4 bits at a single cell, a stack structure of an ONO layer and bit lines are formed on a semiconductor device having a MONOS/SONOS structure. Thus, the data storage capacity can be increased and the density of the cell can be improved. Therefore, the present invention has advantageous effects that it can reduce the size of a memory chip and a production cost.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. A method of manufacturing a semiconductor device, comprising the steps of:

(a) forming a plurality of lower bit lines arranged in a first direction on a semiconductor substrate by performing ion implantation using a mask defining the lower bit lines;

(b) forming a lower field oxide film within a region in which the lower bit lines are formed, thus defining an active region and a device isolation region;

(c) forming a first insulating film for accumulating charges on the active region;

(d) forming a plurality of word lines arranged in parallel in a second direction orthogonal to the first direction of the lower bit lines;

(e) depositing an oxide film on the entire structure of the semiconductor substrate including the lower bit lines and the word lines, flattening the oxide film and then removing the oxide film on the word lines;

(f) forming a second insulating film for accumulating charges corresponding to the first insulating film for accumulating charges on the word lines and then forming an upper field oxide film corresponding to the lower field oxide film on the word lines;

(g) depositing polysilicon on the entire structure of the semiconductor substrate, performing ion implantation for polysilicon using a mask defining upper bit lines to form the upper bit lines, and then performing ion implantation using a mask defining an upper substrate to form the upper substrate; and (h) removing given portions of the upper bit lines formed on the upper field oxide film to separate the upper bit lines.

2. The method as claimed in claim 1, wherein the step (c) comprises the steps of:

forming a first oxide film on the active region;

forming a nitride film on the first oxide film; and forming a second oxide film on the nitride film.

3. The method as claimed in claim 1, wherein the oxide film in the step (e) is formed in thickness of below 7000 Å.

4. The method as claimed in claim 1, wherein the step (f) comprises the steps of:

sequentially depositing a first oxide film and a nitride film on the entire structure of the semiconductor substrate;

removing the nitride film at all the portions except for the portion where the first insulating film for accumulating charges is formed;

depositing an oxide film on the entire structure of the semiconductor substrate and then etching the oxide film to form an upper field oxide film corresponding to the lower field oxide film; and depositing a second oxide film on the entire structure of the semiconductor substrate.

5. The method as claimed in claim 4, wherein the first oxide film is formed in thickness of below 50 Å, the nitride film is formed in thickness of below 60 Å and the second oxide film is formed in thickness of below 50 Å.

* * * * *